United States Patent
Chang et al.

(10) Patent No.: US 7,271,480 B2
(45) Date of Patent: Sep. 18, 2007

(54) CONSTRAINT STIFFENER DESIGN

(75) Inventors: Kuo-Chin Chang, HsinChu (TW); Ching-Yu Ni, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 100 days.

(21) Appl. No.: 11/237,924

(22) Filed: Sep. 29, 2005

(65) Prior Publication Data
US 2007/0069366 A1    Mar. 29, 2007

(51) Int. Cl.
*H01L 23/20* (2006.01)
(52) U.S. Cl. .................... 257/710; 257/704
(58) Field of Classification Search ............ 257/704, 257/706, 707, 710, 711, 718, 719, 726, 727
See application file for complete search history.

(56) References Cited

U.S. PATENT DOCUMENTS

| | | | |
|---|---|---|---|
| 6,020,221 A | * | 2/2000 | Lim et al. ............... 438/125 |
| 6,552,264 B2 | * | 4/2003 | Carden et al. ............... 174/535 |
| 2003/0146511 A1 | * | 8/2003 | Zhao et al. ............... 257/739 |
| 2004/0124517 A1 | * | 7/2004 | Hsieh et al. ............... 257/686 |

* cited by examiner

*Primary Examiner*—S. V. Clark
(74) *Attorney, Agent, or Firm*—Birch, Stewart, Kolasch & Birch, LLP

(57) ABSTRACT

A constraint stiffener for reinforcing an integrated circuit package is provided. In one embodiment, the constraint stiffener comprises a rigid, planar base element for bonding to an integrated circuit substrate. The base element has a plurality of elongated support members, and the base element has an opening therein for surrounding an integrated circuit. The base element and support members reduce warpage due to thermal expansion mismatches between at least the integrated circuit and the substrate. In one embodiment, the elongated support members are detachable from the corners of the base element. In another embodiment, the elongated support members have means for attaching and detaching to the corners of the base element. In yet another embodiment, the elongated support members are detachable from about the midsections of the base element. In another embodiment, the elongated support members have means for attaching and detaching to the midsections of the base element.

22 Claims, 4 Drawing Sheets

CONSTRAINT STIFFENER DESIGN

BACKGROUND

The present invention relates generally to semiconductor chip packages, and more particularly, to a flip chip ball grid array (FCBGA) package having reduced warpage and enhanced structural strength.

Ball grid array (BGA) is an advanced type of integrated circuit packaging technology which is characterized by the use of a substrate whose upper surface is mounted with a semiconductor chip and whose lower surface is mounted with a grid array of solder balls. During a surface mount technology process, for example, the BGA package can be mechanically bonded and electrically coupled to a printed circuit board (PCB) by means of these solder balls.

Flip chip ball grid array is a more advanced type of BGA technology that uses flip chip technology in mounting the active side of the chip in an upside-down manner over the substrate and bonded to the same by means of a plurality of solder bumps attached to input/output pads thereon. Due to the inherent coefficient of thermal expansion mismatches between the chip and the FCBGA package components such as for example the substrate and underfill (an adhesive flowed between the chip and substrate), high package warpage and thermal stresses are frequently induced in the FCBGA package.

These high thermal stresses and warpage not only lead to the delamination in the low-k interconnect layer(s) in the chip, but also cause solder bump cracks leading to failure, degrading the long term operating reliability of the FCBGA package. One method of reducing the warpage of the FCGBG package is to attach a stiffener inside the package. However, even with the use of the stiffener inside the package, the package will still suffer warpage to some degree.

For these reasons and other reasons that will become apparent upon reading the following detailed description, there is a need for an improved FCBGA package that addresses the above-discussed issues.

SUMMARY

The present invention is directed to a constraint stiffener for reinforcing an integrated circuit package. In one embodiment, the constraint stiffener comprises a rigid, planar base element for bonding to an integrated circuit substrate. The base element has a plurality of elongated support members, and the base element has an opening therein for surrounding an integrated circuit. The base element and support members reduce warpage caused by the thermal expansion mismatches between at least the integrated circuit and the substrate. In one embodiment, the elongated support members are detachable from the corners of the base element. In another embodiment, the elongated support members have means for attaching and detaching to the corners of the base element. In yet another embodiment, the elongated support members are detachable from about the midsections of the base element. In another embodiment, the elongated support members have means for attaching and detaching to the midsections of the base element.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures have not been described in detail to avoid unnecessarily obscuring the present invention.

Reference will now be made in detail to the present preferred embodiments of the present invention, examples of which are illustrated in the accompanying drawings.

Figure 1:
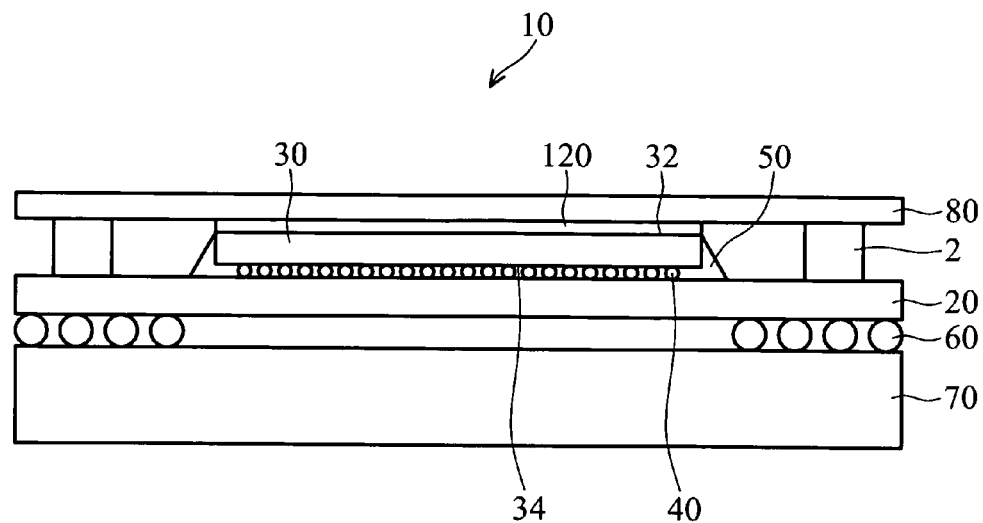
FIG. 1 is a cross-sectional view of a conventional semi-finished flip chip ball grid array package showing a stiffener mounted to a substrate.

FIG. 1 is a cross-sectional view of a conventional semi-finished flip chip ball grid array (FCBGA) package showing a stiffener mounted to a substrate. FCBGA package 10 includes a chip 30 having an upper surface 32 and a lower surface 34 opposite the upper surface 32. A set of solder bumps 40 is connected to contact pads (not shown) on the lower surface 34 of chip 30. The combination of the chip 30 and the solder bumps 40 are commonly known as and referred to as a flip chip. Chip 30 is secured to a first substrate 20 underlying chip 30. Solder bumps 40 are attached to contact pads (not shown) on an upper surface of first substrate 20. An underfill 50 may be filled between chip 30 and first substrate 20 to stiffen the FCBGA package 10 and further protect chip 30 from flexural damage. A set of solder balls 60 may be secured to contact pads (not shown) on a lower surface of first substrate 20. Solder balls 60 may also be secured to contact pads (not shown) on a second substrate 70. The second substrate 70 may be a printed wire board (also sometimes called a printed circuit board) or may be a multilayer module known to those skilled in the art.

Figure 2:
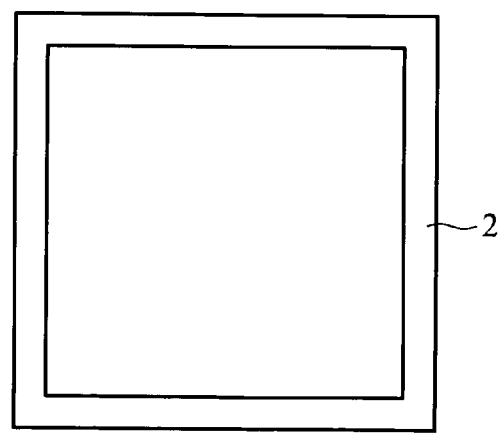
FIG. 2 is a top plan view of a conventional stiffener.

The FCBGA package 10 may also include a heat spreader 80 and stiffener 2 for preventing excess warpage of the package. Heat spreader 80 is mounted on top of chip 30 to dissipate heat generated by chip 30 and to counter-balance the forces exerted by the thermal expansion mismatches between at least the chip 30 and the first substrate 20. Stiffener 2 is mounted between first substrate 20 and heat spreader 80 by means of adhesives (not shown). A top plan view of stiffener 2 is shown in FIG. 2. The conventional FCBGA package 10 may also include a thermal interface material (TIM) 120 disposed between chip 30 and heat spreader 80 for transferring the heat generated by chip 30 to heat spreader 80.

Figure 3:
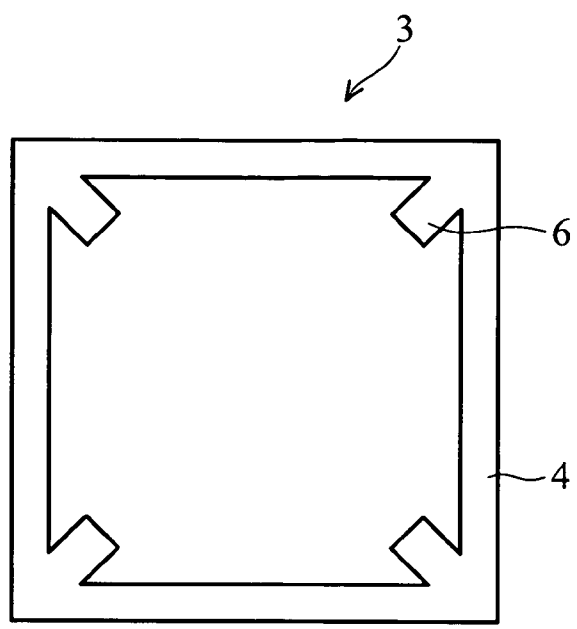
FIG. 3 is a top plan view of a constraint stiffener according to a first embodiment of the present invention.

The various embodiments of stiffeners of the present invention offer a degree of rigidity against warping and twisting higher than that of conventional stiffeners. FIG. 3 is a top plan view of a constraint stiffener 3 according to a first embodiment of the present invention. Constraint stiffener 3 preferably has as much surface area mounted to first substrate 20 as possible, so that it can aid, to as great an extent as possible, in structurally reinforcing the FCBGA package 10 against twisting and warping. The dimensions of the constraint stiffener 3 is largely determined by the size of the package and is dependent on at least the size and shape of first substrate 20. Constraint stiffener 3 may have a thickness of from about 500 to about 1,000 microns.

Constraint stiffener 3 has a rigid, planar base element 4 for bonding on one side to first substrate 20, and on the other side to a heat dissipating element such as, for example, heat spreader 80. Preferably, constraint stiffener 3 is formed of a rigid material. In one embodiment, constraint stiffener 3 comprises a metal, such as for example, copper. In another embodiment, constraint stiffener 3 comprises a ceramic material. In yet another embodiment, constraint stiffener 3 comprises a silicon containing material. However, one skilled in the art will understand that constraint stiffener 3 may be made from any material, which provides a sufficient degree of rigidity to FCBGA package 10 against warpage and twisting.

The base element 4 of constraint stiffener 3 has an opening therein for surrounding an integrated circuit device, such as chip 30. It is appreciated that the size of the opening and therefore the constraint stiffener 3 is dependent upon the size of the integrated circuit device (chip), which constraint stiffener 3 must receive and surround. Preferably, the opening and constraint stiffener 3 are sized so as to maximize the surface area of constraint stiffener 3 that can be mounted to first substrate 20, so as to reduce twisting and warping as much as possible.

Referring back to FIG. 3, the base element 4 has a plurality of elongated support members 6. Elongated support members 6 allow constraint stiffener 3 to have a greater amount of surface area mounted to first substrate 20, which improves the structural strength of FCBGA package 10. Base element 4 and support members 6 reduce warpage due to the thermal expansion mismatches between at least the chip 30 and components of FCBGA package 10. In one embodiment, as shown in FIG. 3, the base element 4 has a plurality of elongated support members 6 formed at the corners of base member 4.

Figure 6:
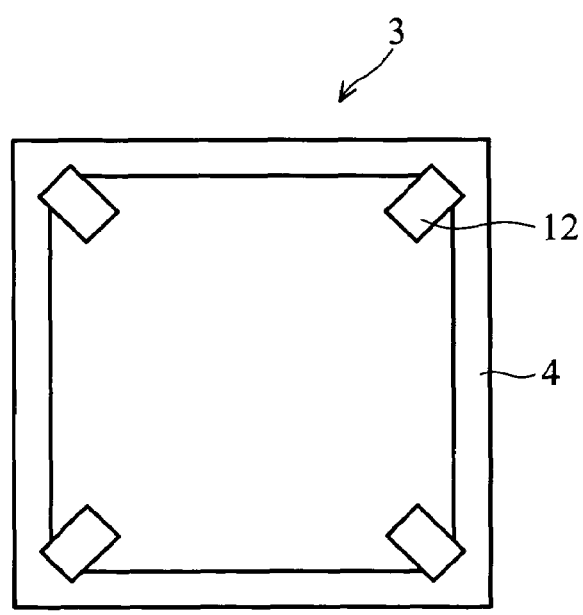
FIG. 6 is a top plan view of a constraint stiffener according to a fourth embodiment of the present invention.
Figure 7:
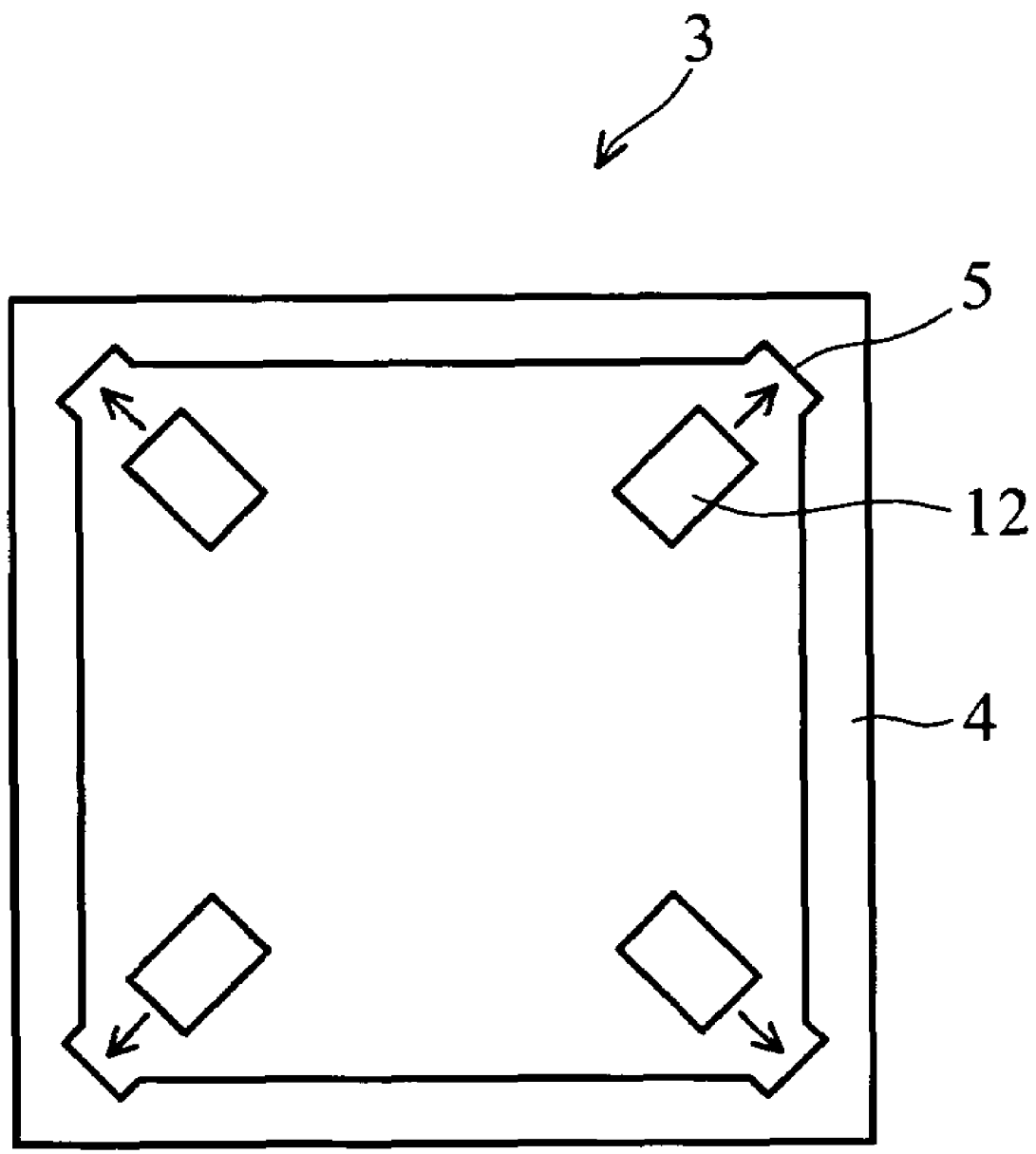
FIG. 7 is a top plan view of the constraint stiffener of FIG. 6 showing attachment and detachment of support members from the constraint stiffener according to aspects of the present invention.

In another embodiment, as shown in FIGS. 6 and 7, the plurality of elongated support members 12 are detachable from the corners of the base member 4. The elongated support members 12 may be attached and detached from the corners of base member 4 by way of attaching and detaching means. Such examples of means for attaching and detaching may include the following: pin and groove, clamp, lock, cleat, docking, hook, joint, latch, and equivalents thereof. For instance, in the pin and groove means, the elongated support members 12 may have pins attached thereto for slidably engaging grooves in the base member 4. Conversely, the elongated support members 12 may have grooves therein for slidably engaging pins in the base member 4. These and other fastening means and variations thereof are clear to those skilled in the art and therefore are not specifically set forth.

With reference to FIG. 7, rather than having square corners or slightly rounded corners, the corners of base element 4 have bevels 5 for attaching detachable support members 12. Bevels 5 allow constraint stiffener 3 to have a greater amount of surface area mounted to first substrate 20, which improves the structural strength of FCBGA package 10. The support members 12 are made detachable and not fixed to base element 4 so that constraint stiffener 3 can be made adaptable to chip 30 having various dimensions and shapes. Each of the plurality of elongated support members 12 may have various dimensions and shapes and such dimensions and shapes are determined by the design requirements for particular integrated circuit package applications.

Figure 4:
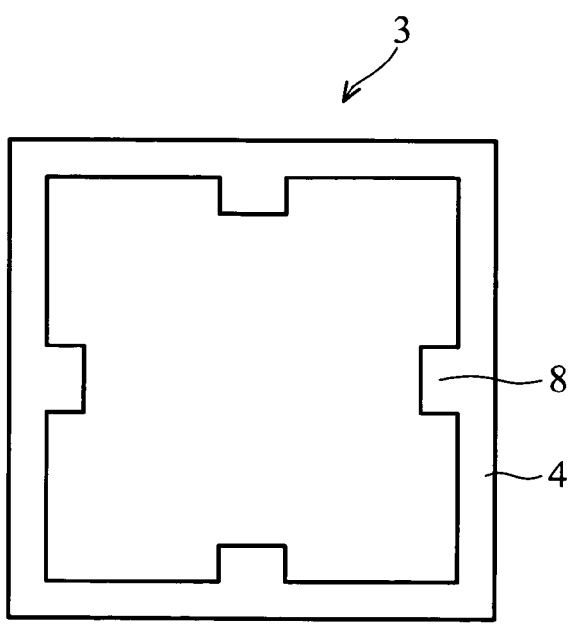
FIG. 4 is a top plan view of a constraint stiffener according to a second embodiment of the present invention.
Figure 5:
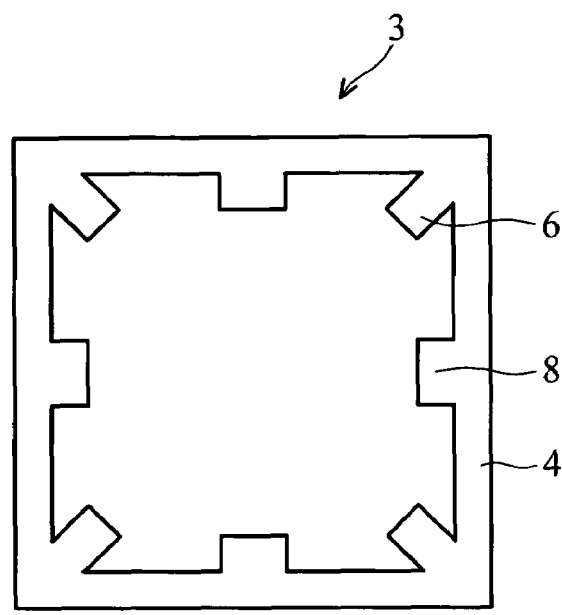
FIG. 5 is a top plan view of a constraint stiffener according to a third embodiment of the present invention.

In another embodiment, as shown in FIG. 4, the base member 4 has a plurality of elongated support members 8 formed at the midsections of the base member 4. In yet another embodiment, the plurality of elongated supporting members 8 are detachable from the midsections of the base member 4, as explained above with reference to FIGS. 6 and 7. In yet another embodiment, as depicted in FIG. 5, the base member 4 has a plurality of elongated support members 6 formed at the corners of the base member 4 and a plurality of elongated support members 8 formed at the midsections of the base member 4. In likewise fashion, the support members 6 and 8 of base member 4 may be detachable from the base member 4, as explained above with reference to FIGS. 6 and 7.

In all of these embodiments, the base member 4 and the elongated support members 6, 8 and 12 reduce warpage and twisting of the FCBGA package 10 by offering reinforcement thereto. The embodiments of the constraint stiffener of the present invention reinforce the integrated circuit package against twisting and warping thereby improving the performance of the package when compared to integrated circuit packages using conventional stiffeners. It is appreciated that there are many different embodiments of the constraint stiffener in accordance with aspects of the present invention, of which the figures necessarily show just a few.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A constraint stiffener for reinforcing an integrated circuit package, the constraint stiffener comprising:
   a rigid, planar base element for bonding to an integrated circuit substrate, the base element having a plurality of elongated support members which are detachable, and the base element having an opening therein for surrounding an integrated circuit, wherein the base element and support members reduce warpage due to thermal expansion mismatches between at least the integrated circuit and the substrate.

2. The constraint stiffener of claim 1, wherein the base element has a plurality of elongated support members at the corners of the base member.

3. The constraint stiffener of claim 2, wherein the plurality of elongated support members are detachable from the corners of the base element.

4. The constraint stiffener of claim 3, wherein the elongated support members have means for attaching and detaching to the corners of the base element.

5. The constraint stiffener of claim 1, wherein the base element has a plurality of elongated support members at about the midsections of the base element.

6. The constraint stiffener of claim 5, wherein the plurality of elongated support members are detachable from at about the midsections of the base element.

7. The constraint stiffener of claim 6, wherein the elongated support members have means for attaching and detaching to the midsections of the base element.

8. The constraint stiffener of claim 1, wherein the base element has a plurality of elongated support members at the corners and at about die midsections of the base element.

9. The constraint stiffener of claim 1, wherein the constraint stiffener comprises metal.

10. The constraint stiffener of claim 1, wherein the constraint stiffener comprises silicon.

11. The constraint stiffener of claim 1, wherein the constraint stiffener comprises ceramic.

12. An integrated circuit package, comprising:
a package substrate;
an integrated circuit mounted on one side to the package substrate; and
a constraint stiffener mounted to the package substrate, the constraint stiffener comprising:
a rigid, planar base element for banding to the package substrate, the base element having a plurality of elongated support members which are detachable, and the base element having an opening therein for surrounding the integrated circuit, wherein the base element and support members reduce warpage due to thermal expansion mismatches between at least the integrated circuit and the package substrate.

13. The integrated circuit package of claim 12, wherein the base element has a plurality of elongated support members at the corners of the base member.

14. The integrated circuit package of claim 13, wherein the plurality of elongated support members are detachable from die corners of the base element.

15. The constraint stiffener of claim 14, wherein the elongated support members have means for attaching and detaching to the corners of the base element.

16. The integrated circuit package of claim 12, wherein the base element has a plurality of elongated support members at about the midsections of the base element.

17. The integrated circuit package of claim 16, wherein the plurality of elongated support members are detachable from at about the midsections of the base element.

18. The constraint stiffener of claim 17, wherein the elongated support members have means for attaching and detaching to the midsections of the base element.

19. The integrated circuit package of claim 12, wherein the base element has a plurality of elongated support members at the corners and at about the midsections of the base element.

20. The integrated circuit package of claim 12, wherein the constraint stiffener comprises metal.

21. The integrated circuit package of claim 12, wherein the constraint stiffener comprises silicon.

22. The integrated circuit package of claim 12, wherein the constraint stiffener comprises ceramic.

* * * * *